(12) United States Patent
Sone et al.

(10) Patent No.: US 8,329,050 B2
(45) Date of Patent: Dec. 11, 2012

(54) SUBSTRATE PROCESSING METHOD

(75) Inventors: Takashi Sone, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 568 days.

(21) Appl. No.: 12/545,144

(22) Filed: Aug. 21, 2009

(65) Prior Publication Data

US 2010/0048026 A1 Feb. 25, 2010

Related U.S. Application Data

(60) Provisional application No. 61/103,267, filed on Oct. 7, 2008.

(30) Foreign Application Priority Data

Aug. 25, 2008 (JP) ................................. 2008-215180

(51) Int. Cl.
| B44C 1/22 | (2006.01) |
| C03C 15/00 | (2006.01) |
| C03C 25/68 | (2006.01) |
| C23F 1/00 | (2006.01) |

(52) U.S. Cl. .......................................... 216/46; 438/696
(58) Field of Classification Search .................... 216/46, 216/67; 438/696
See application file for complete search history.

(56) References Cited

U.S. PATENT DOCUMENTS

2004/0217086 A1 11/2004 Kawashima
2006/0141766 A1 6/2006 Kim

FOREIGN PATENT DOCUMENTS

| CN | 1495854 A | 5/2004 |
| JP | 2-12915 | 1/1990 |
| JP | 2553078 B2 | 11/1996 |
| JP | 2006-190939 | 7/2006 |

OTHER PUBLICATIONS

Office Action issued Jun. 30, 2011, in Chinese Patent Application No. 200910168595.0 with English translation.
Office Action issued Sep. 30, 2011, in Chinese Patent Application No. 200910168595.0 with English translation.
Office Action issued May 22, 2012, in Japanese Patent Application No. 2008-215180.

*Primary Examiner* — Roberts Culbert
(74) *Attorney, Agent, or Firm* — Rothwell, Figg, Ernst & Manbeck, P.C.

(57) ABSTRACT

A substrate processing method for processing a substrate, on which a processing target layer, an intermediate layer, and a mask layer having an opening to expose a part of the intermediate layer are stacked in this order, includes a shrink etching step. In the shrink etching step, an opening width of the opening of the mask layer is reduced by depositing deposits on a sidewall surface thereof by a plasma generated from a gaseous mixture of depositive gas expressed by a general formula $C_xH_yF_z$ (x, y and z being positive integers) and $SF_6$ gas. Also, there is formed in the intermediate layer an opening having an opening width corresponding to the reduced opening width of the opening of the mask layer by etching the intermediate layer.

11 Claims, 5 Drawing Sheets

SUBSTRATE PROCESSING METHOD

FIELD OF THE INVENTION

The present invention relates to a substrate processing method; and, more particularly, to a substrate processing method for processing a substrate on which a processing target layer, an intermediate layer and a mask layer are stacked in this order.

BACKGROUND OF THE INVENTION

There is known a wafer for a semiconductor device in which an oxide film containing impurities, e.g., a Tetra Ethyl Ortho Silicate (TEOS) film, formed by a CVD process or the like, a conductive film such as a TiN film, a bottom anti-reflection coating (BARC) film and a photoresist film are stacked in this order on a silicon base member (see, e.g., Patent Document 1). The photoresist film is formed in a predetermined pattern by photolithography, and serves as a mask layer when the BARC film and the conductive film are etched.

A recent trend toward miniaturization of semiconductor devices requires a finer circuit pattern on a wafer surface. In order to form a finer circuit pattern, it is necessary to form, in an etching target film, an opening (via hole or trench) of a small size by reducing a minimum size of a pattern in a photoresist film during a semiconductor device manufacturing process.

[Patent Document 1] Japanese Patent Laid-open Publication No. 2006-190939

Although the minimum size of the pattern in the photoresist film is restricted by a minimum size that can be developed by photolithography, the minimum size that can be mass-produced by photolithography is limited due to variation of a focal length or the like. The minimum size that can be mass-produced by photolithography is, e.g., about 80 nm. On the other hand, a processing size that satisfies the demand for miniaturization of semiconductor devices is about 30 nm.

The trend of further reduction in the size that satisfies the demand for miniaturization of semiconductor devices requires the development of a technique for forming, in an etching target film, an opening having the size that satisfies the demand for miniaturization.

SUMMARY OF THE INVENTION

In view of the above, the present invention provides a substrate processing method for forming an opening of a size that satisfies a demand for miniaturization of semiconductor devices in a mask film or an intermediate film on a substrate to be processed and transcribing the opening onto an etching target film.

In accordance with an embodiment of the present invention, there is provided a substrate processing method for processing a substrate on which a processing target layer, an intermediate layer, and a mask layer having an opening to expose a part of the intermediate layer are stacked in this order, the method comprising: a shrink etching step for reducing an opening width of the opening of the mask layer by depositing deposits on a sidewall surface thereof by a plasma generated from a gaseous mixture of depositive gas expressed by a general formula $C_xH_yF_z$ (x, y and z being positive integers) and $SF_6$ gas, and also forming, in the intermediate layer, an opening having an opening width corresponding to the reduced opening width of the opening of the mask layer by etching the intermediate layer.

In the substrate processing method, the depositive gas may be $CH_3F$ gas.

In the substrate processing method, a mixing ratio of the depositive gas to the $SF_6$ gas may range from about 1:2 to about 1:9.

In the substrate processing method, a mixing ratio of the depositive gas to the $SF_6$ gas may be about 1:4.

In the substrate processing method, in the shrink etching step, a bias power of about 50 W to about 150 W may be applied to the substrate.

In the substrate processing method, processing time of the shrink etching step may be about 1 to 2 minutes.

In the substrate processing method, in the shrink etching step, a pressure in a chamber accommodating the substrate may be adjusted to about 1.3 Pa (about 10 mTorr) to about 6.5 Pa (about 50 mTorr).

In the substrate processing method, the intermediate layer to be etched in the shrink etching step may be a bottom anti-reflection coating (BARC) film stacked below the mask layer.

In accordance with the substrate processing method of the present invention, the opening width of the opening of the mask layer is reduced by depositing deposits on the sidewall surface thereof by the plasma generated from the gaseous mixture of depositive gas expressed by a general formula $C_xH_yF_z$ (x, y and z being positive integers) and $SF_6$ gas and, also, an opening corresponding to the reduced opening of the mask layer is formed in the intermediate layer by etching the intermediate layer. Accordingly, an opening pattern having an opening width that satisfies a demand for miniaturization of semiconductor devices can be formed in the mask layer and the intermediate layer and transcribed onto the etching target film.

In accordance with the substrate processing method of the present invention, $CH_3F$ gas is used as a depositive gas, so that the opening width can be reduced by depositing deposits on the sidewall surface of the opening of the mask layer and the sidewall surface of the opening of the etched intermediate layer.

In accordance with the substrate processing method of the present invention, the mixing ratio of depositive gas to $SF_6$ gas is set to about 1:2 to 1:9. Thus, the opening widths of the opening of the mask layer and the opening of the intermediate layer can be reduced while etching the intermediate layer by the synergy effect between the opening width reducing (shrink) effect of the depositive gas and the etching effect of the $SF_6$ gas. Further, due to the adhesion of S-based products generated from $SF_6$ gas, the sidewall surface of the opening or the top surface of the mask layer can be maintained in a smooth state without becoming rough.

In accordance with the substrate processing method of the present invention, the shrink effect of the depositive gas and the etching effect of the $SF_6$ gas can be optimally provided.

In accordance with the substrate processing method of the present invention, the bias power of about 50 to 150 W is applied to the substrate in the shrink etching step, so that the deposits can be efficiently adhered to the sidewall surface of the opening.

In accordance with the substrate processing method of the present invention, the processing time of the shrink etching step is set to about 1 to 2 minutes and, hence, an opening having a reduced opening width can be formed in the mask layer and the intermediate layer within minimum processing time.

In accordance with the substrate processing method of the present invention, the pressure in the chamber accommodating a substrate is adjusted to about 1.3 Pa (10 Torr) to 6.5 Pa (50 mTorr) in the shrink etching step. Accordingly, the roughness and the abrasion of the substrate surface can be suppressed.

In accordance with the substrate processing method of the present invention, the intermediate layer to be etched in the shrink etching step is the BARC film stacked below the mask layer, so that an opening having a size satisfying a demand for miniaturization of semiconductor devices can be formed in the BARC film as well as in the mask layer.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENT

The embodiments of the present invention will be described with reference to the accompanying drawings which form a part hereof.

First of all, a substrate processing system for performing a substrate processing method in accordance with an embodiment of the present invention will be described. The substrate processing system includes a plurality of process modules configured to perform etching or ashing on a substrate, e.g., a semiconductor wafer W, by using a plasma.

Figure 1:
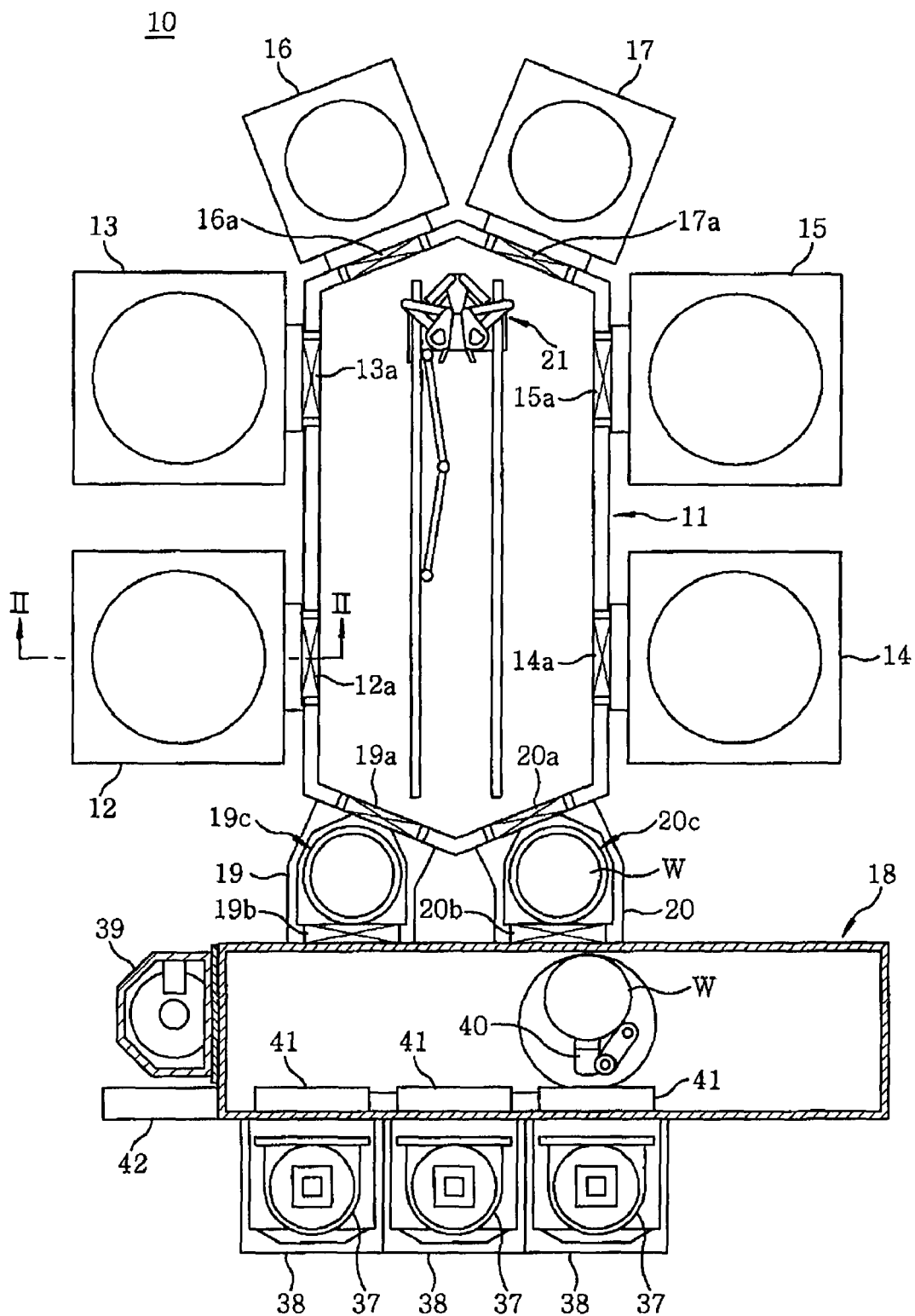
FIG. 1 is a top view schematically showing a configuration of a substrate processing system for performing a substrate processing method in accordance with an embodiment of the present invention.

FIG. 1 is a top view schematically showing the configuration of the substrate processing system for performing the substrate processing method in accordance with an embodiment of the present invention.

Referring to FIG. 1, a substrate processing system 10 includes a transfer module 11 of a hexagonal shape seen from above, two process modules 12 and 13 connected to one side of the transfer module 11, and two process modules 14 and 15 connected to the other side of the transfer module 11 so as to face the two process modules 12 and 13. The substrate processing system 10 further includes a process module 16 adjacent to the process module 13 and connected to the transfer module 11, a process module 17 adjacent to the process module 15 and connected to the transfer module 11, a rectangular loader module 18 serving as a transfer chamber, and two load-lock modules 19 and 20 provided between the transfer module 11 and the loader module 18 so as to connect the transfer module 11 and the loader module 18.

The transfer module 11 has therein a transfer arm 21 capable of contracting, extending and revolving, and the transfer arm 21 transfers a wafer W between the process modules 12 to 17 and the load-lock modules 19 and 20.

The process module 12 has a processing chamber in which a wafer W is accommodated. A gaseous mixture of CF-based depositive gas, e.g., $CHF_3$ gas, and halogen-based gas, e.g., $SF_6$ gas, is introduced as a processing gas into the chamber. The introduced processing gas is converted into a plasma by an electric filed generated in the chamber, and the wafer W is etched by the plasma thus generated.

Figure 2:
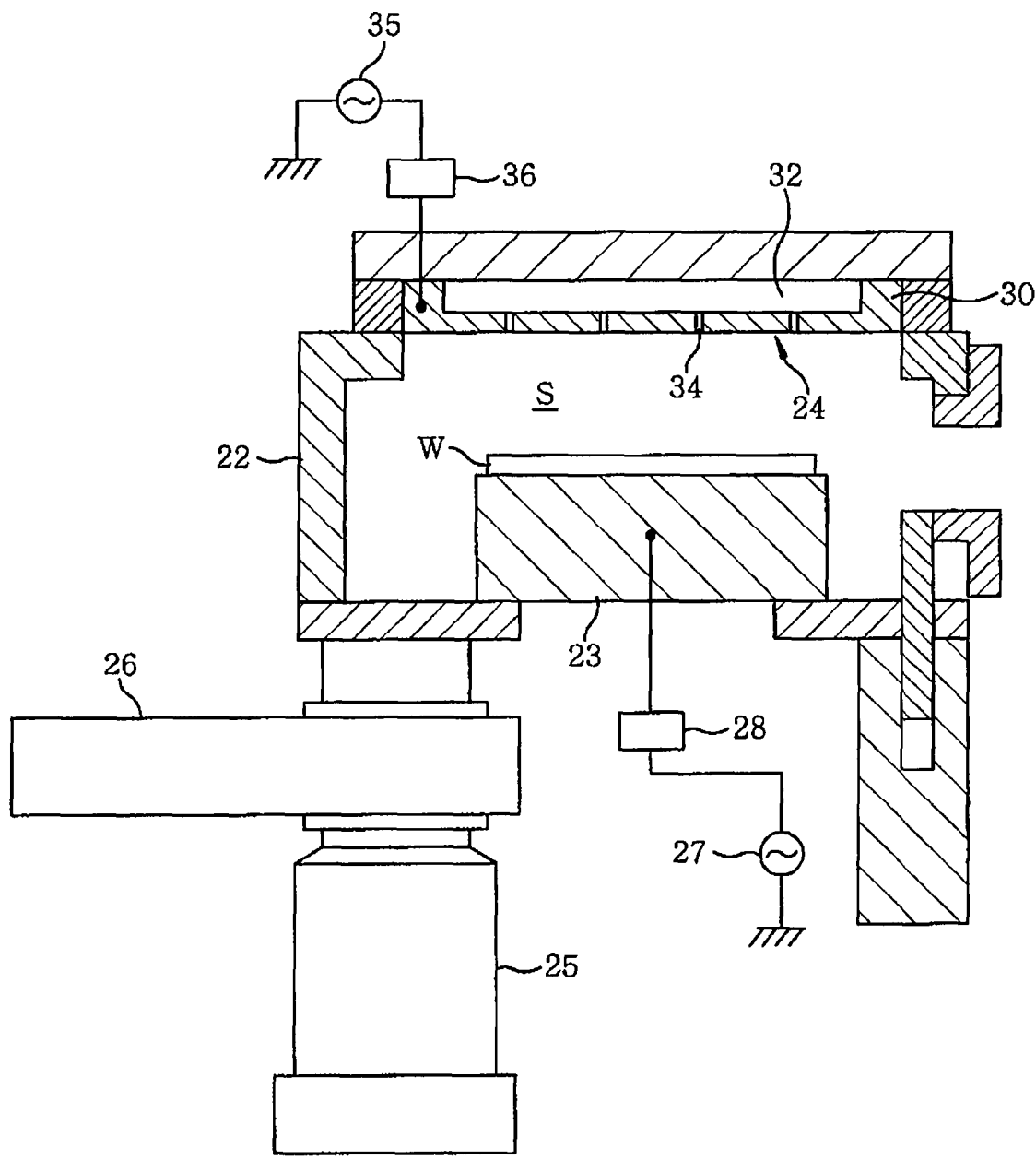
FIG. 2 describes a cross sectional view taken along line II-II of FIG. 1.

FIG. 2 illustrates a cross sectional view taken along line II-II of FIG. 1.

Referring to FIG. 2, the process module 12 includes a processing chamber 22, a wafer mounting table 23 provided in the chamber 22, a shower head 24 disposed above the chamber 22 so as to face the mounting table 23, a Turbo Molecular Pump (TMP) 25 for exhausting a gas or the like in the chamber 22, and an Adaptive Pressure Control (APC) valve 26 serving as a variable butterfly valve, disposed between the chamber 22 and the TMP 25, for controlling a pressure in the chamber 22.

A high frequency power supply 27 is connected to the mounting table 23 via a matcher 28, and supplies a high frequency power to the mounting table 23. Accordingly, the mounting table 23 serves as a lower electrode. Further, the matcher 28 maximizes the supply efficiency of the high frequency power to the mounting table 23 by reducing reflection of the high frequency power from the mounting table 23. The mounting table 23 applies the high frequency power supplied from the high frequency power supply 27 to a processing space S.

The shower head 24 has a circular plate-shaped gas supply unit 30, and the gas supply unit 30 has a buffer chamber 32. The buffer chamber 32 communicates with the chamber 22 via gas ventholes 34.

The buffer chamber 32 is connected to a $CHF_3$ gas supply system and an $SF_6$ gas supply system (both are not shown). The $CHF_3$ gas supply system supplies $CHF_3$ gas to the buffer chamber 32. Further, the $SF_6$ gas supply system supplies $SF_6$ gas to the buffer chamber 32. The supplied $CHF_3$ gas and $SF_6$ gas are supplied to the chamber 22 via the gas ventholes 34.

A high frequency power supply 35 is connected to the shower head 24 via a matcher 36, and supplies a high frequency power to the shower head 24. Accordingly, the shower head 24 serves as an upper electrode. Further, the matcher 36 has the same function as that of the matcher 28. Moreover, the shower head 24 applies the high frequency power supplied from the high frequency power supply 35 to the processing space S.

In the chamber 22 of the process module 12, the processing gas, supplied from the shower head 24 to the processing space S, is converted into a high-density plasma by the high frequency power applied from the mounting table 23 and the shower head 24 to the processing space S, so as to produce ions or radicals, thus performing a shrink etching step to be described later.

Referring back to FIG. 1, the process module 13 has a processing chamber accommodating the wafer W that has been subjected to the shrink etching in the process module 12, and a gaseous mixture of Ar gas, $N_2$ gas, $SF_6$ gas and $CH_3F$ gas is introduced as a processing gas into the chamber. The introduced processing gas is converted into a plasma by an electric filed generated in the chamber, and the wafer W is etched by the plasma thus generated. Further, the process module 13 has the same configuration as that of the process module 12, and includes an Ar gas supply system, an $N_2$ gas supply system, an $SF_6$ gas supply system and a $CH_3F$ gas supply system (all are not shown).

The process module 14 has a processing chamber accommodating the wafer W that has been subjected to the etching process in the process module 13, and $O_2$ gas is introduced as a processing gas into the chamber. The introduced processing gas is converted into a plasma by the electric field generated in the chamber, and the wafer W is ashed by the plasma thus generated. Further, the process module 14 has the same configuration as that of the process module 12, and is provided with a shower head having only a circular plate-shaped gas supply unit in which an $O_2$ gas supply system is connected to a buffer chamber (all are not shown), instead of the shower head 24 having the gas supply unit 30 connected to various gas supply systems.

The inner spaces of the transfer module 11 and the process modules 12 to 17 are maintained at a depressurized state. Further, the transfer module 11 is connected to the process modules 12 to 17 via vacuum gate valves 12a to 17a.

In the substrate processing system 10, the inner pressure of the loader module 18 is maintained at an atmospheric pressure, whereas the inner pressure of the transfer module 11 is maintained in a vacuum state. Thus, each of the load-lock units 19 and 20 is configured as a preliminary vacuum transfer chamber whose inner pressure can be controlled by vacuum gate valves 19a and 20a provided at connecting portions with the transfer module 11 and atmospheric door valves 19b and 20b provided at connecting portions with the loader module 18. Further, the load-lock units 19 and 20 respectively have wafer mounting tables 19c and 20c for temporarily mounting thereon a wafer W transferred between the loader module 18 and the transfer module 11.

The loader module 18 is connected to, in addition to the load-lock modules 19 and 20, three FOUP mounting tables 38, each for mounting thereon a FOUP (Front Opening Unified Pod) 37 as a container accommodating therein, e.g., 25 wafers W, and an orienter 39 for pre-aligning the position of the wafer W unloaded from the FOUP 37.

The load-lock modules 19 and 20 are connected to a lengthwise sidewall of the loader module 18, and are disposed to face the three FOUP mounting tables 38 with the loader module 18 therebetween. The orienter 39 is disposed at one lengthwise end of the loader module 18.

The loader module 18 has therein a scalar dual-arm type transfer arm 40 for transferring a wafer W and three load ports 41 arranged at a sidewall so as to correspond to the FOUP mounting tables 38, the load ports 41 serving as input ports of the wafer W. The transfer arm 40 takes out the wafer W from the FOUP 37 mounted on the FOUP mounting table 38 via the load port 41, and loads and unloads the taken-out wafer W to and from the load-lock modules 19 and 20 or the orienter 39.

Further, the substrate processing system 10 has an operation panel 42 disposed at one lengthwise end of the loader module 18. The operation panel 42 has a display unit formed of, e.g., an LCD (Liquid Crystal Display), and the display unit displays thereon an operational status of each component of the substrate processing system 10.

Figure 3:
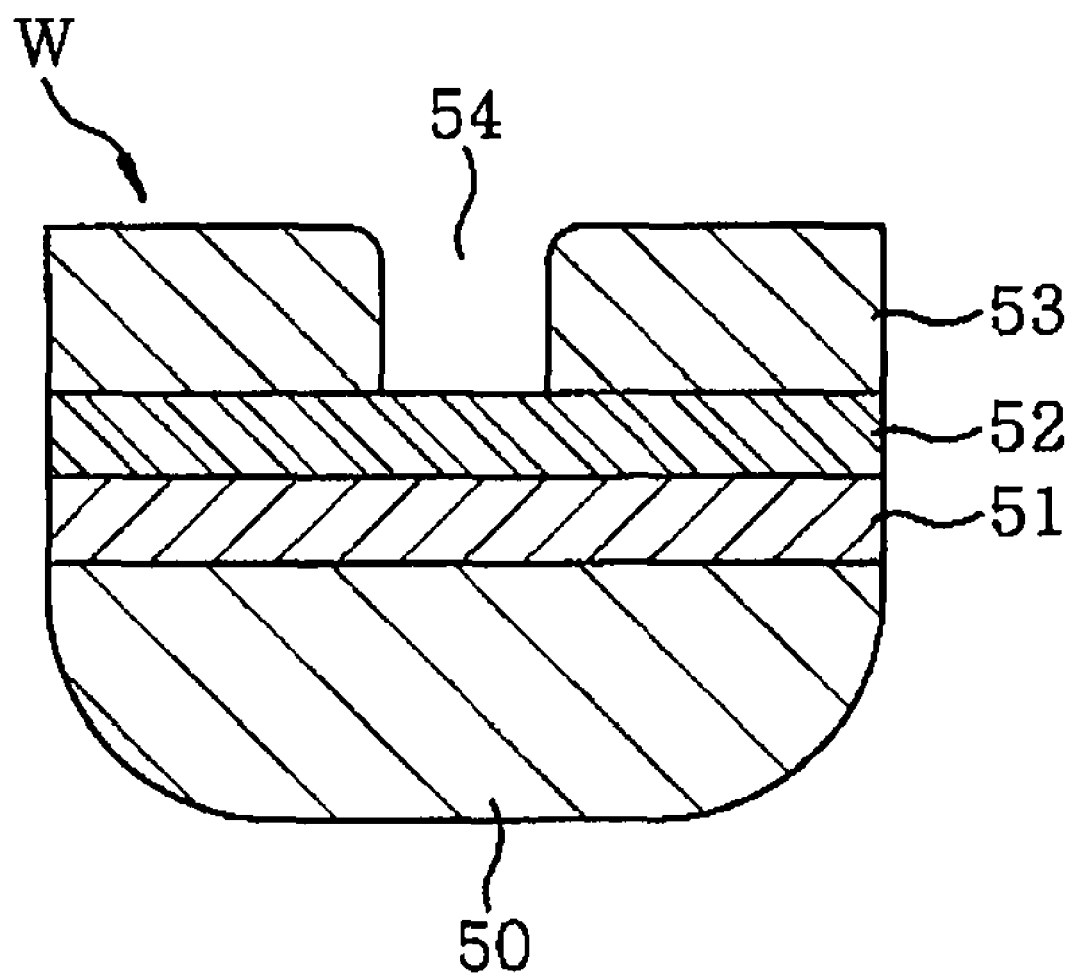
FIG. 3 provides a cross sectional view schematically illustrating a configuration of a semiconductor wafer on which plasma processing is performed by using the substrate processing system of FIG. 1.

FIG. 3 is a cross sectional view schematically showing a configuration of a semiconductor wafer on which a plasma processing is performed by the substrate processing system of FIG. 1.

Referring to FIG. 3, the wafer W includes a silicon nitride (SiN) film 51 serving as a processing target layer formed on a surface of a silicon base member 50, a bottom anti-reflection coating (BARC) film 52 formed on the SiN film 51, and a photoresist film (mask film) 53 formed on the BARC film 52.

The silicon base member 50 is a circular plate-shaped thin plate made of silicon, and the SiN film 51 is formed on a surface thereof by performing, e.g., a CVD process. The BARC film 52 is formed on the SiN film 51 by performing, e.g., a coating process. The BARC film 52 is made of polymer resin containing a pigment that absorbs beam having a particular wavelength, e.g., ArF excimer laser beam irradiated toward the photoresist film 53, and prevents the ArF excimer laser beam that has passed through the photoresist film 53 from being reflected by the SiN film 51 and reaching the photoresist film 53 again. The photoresist film 53 is formed on the BARC film 52 by using, e.g., a spin coater (not shown). The photoresist film 53 is made of positive photosensitive resin, and is changed into alkali-soluble one when it is irradiated with the ArF excimer laser beam.

In the wafer W configured as described above, the ArF excimer laser beam is irradiated by a stepper (not shown) onto the photoresist film 53 in an inverted predetermined pattern, so that the part of the photoresist film 53 which is irradiated with the ArF excimer laser beam is changed into alkali-soluble one. Then, strong alkali developing solution is dropped on the photoresist film 53, thereby removing the part that has changed into alkali-soluble one. As a consequence, the part of the photoresist film 53 corresponding to the inverted predetermined pattern is removed, and the photoresist film 53 of a predetermined pattern, e.g., the photoresist film 53 having an opening 54 at a position where a via hole is formed, remains on the wafer W.

In order to satisfy the demand for miniaturization of semiconductor devices, it is necessary to form, in the etching target film, an opening (via hole or trench) of a small size, specifically a width (CD (Critical Dimension) value) of about 30 nm. However, a size that can be mass-produced by photolithography is, e.g., about 80 nm. Therefore, it is difficult to form an opening having an opening width satisfying the demand for miniaturization of semiconductor devices in the etching target film during the etching process of the wafer W.

The inventors of the present invention have performed various tests in order to discover a method for forming, in a wafer W, an opening having an opening width that satisfies a demand for miniaturization of semiconductor devices. As a result, they have found that when plasma processing is performed on the wafer W, in which the SiN film 51 serving as a processing target layer, the BARC film 52 and the photoresist film 53 having the opening 54 for exposing a part of the BARC film 52 are stacked in this order on the silicon base member 50, by using a gaseous mixture of CF-based depositive gas $C_xH_yF_z$ (x, y and z being positive integers) and $SF_6$ gas, deposits are deposited on the sidewall surface of the opening 54 formed in the photoresist film 53 to have an opening width of about 80 nm such that the opening width can be reduced (shrunk) and, also, the BARC film 52 is etched such that an opening having a same opening width as the shrunk opening width of the photoresist film 53 can be formed in the BARC film 52.

Here, the depositive gas has a function of reducing an opening width of the opening 54 of, e.g., the photoresist film 53 serving as a mask layer, as the deposits 55 are deposited on the sidewall surface of the opening 54 by the plasma processing using the corresponding gas.

The following is detailed description of a substrate processing method in accordance with an embodiment of the present invention.

This substrate processing method includes a shrink etching step for etching the BARC film 52 serving as an intermediate layer while reducing the opening width of the opening 54 formed in the photoresist film 53 of the wafer W by depositing deposits on the sidewall surface of the opening 54 by performing the plasma processing.

FIGS. 4A to 4D and 5A to 5C show steps of the substrate processing method in accordance with the embodiment of the present invention.

Figure 4A:
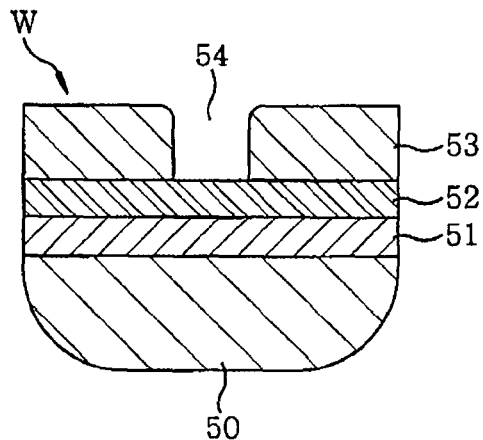
FIGS. 4A to 4D illustrate the steps of the substrate processing method in accordance with the embodiment of the present invention.
Figure 4B:
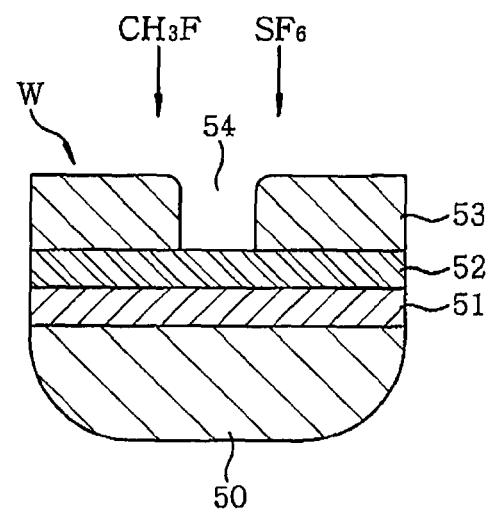
Figure 4C:
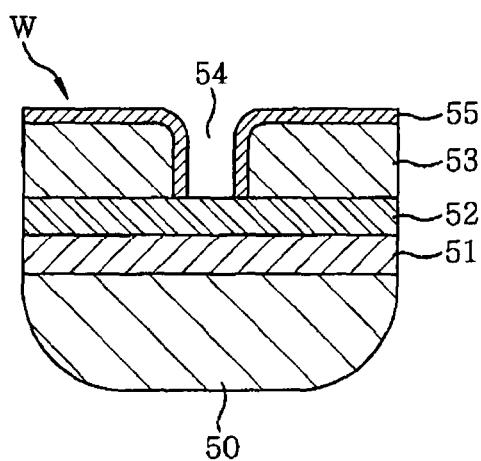

Referring to FIGS. 4A to 4D, first of all, there is prepared the wafer W in which the SiN film 51 serving as a processing target layer, the BARC film 52, and the photoresist film 53 are stacked in this order on the silicon base member 50 (FIG. 4A). The photoresist film 53 has the opening 54, and the opening width of the opening 54 is, e.g., about 83 nm. The total thickness of the photoresist film 53 and the BARC film 52 is, e.g., about 198 nm. This wafer W is loaded into the chamber 22 of the process module 12 (see FIG. 2), and then is mounted on the mounting table 23.

Next, a pressure in the chamber 22 is set to, e.g., 3.3 Pa (25 mTorr) by using the APC valve 26 or the like. Further, a temperature of the wafer W is set to, e.g., 80° C. Moreover, $CH_3F$ gas is supplied from the gas supply unit 30 of the shower head 24 to the chamber 22 at a flow rate of about 100 to 300 sccm, preferably, 200 sccm. Further, $SF_6$ gas is supplied to the chamber 22 at a flow rate of about 700 to 900 sccm, preferably, 800 sccm. Besides, a high frequency power of about 100 W is supplied to the mounting table 23 and, at the same time, a high frequency power of about 600 W is supplied to the shower head 24. In this case, the $CH_3F$ gas and the $SF_6$ gas are converted into a plasma by the high frequency power applied to the processing space S, thereby generating ions or radicals (see FIG. 4B). These ions or radicals collide and react with the surface of the photoresist film 53, the inner wall surface of the opening 54, and the portion of the BARC film 52 which is not covered by the photoresist film 53. Accordingly, the deposits 55 are deposited on the corresponding portions, and the corresponding portion of the BARC film 52 is etched.

As a consequence, the opening width of the opening 54 of the photoresist film 53 is reduced, and an opening having a same opening width as the reduced opening width of the opening of the photoresist film 53 is formed in the BARC film 52 by etching the BARC film 52. At this time, deposits 55 are also deposited on the sidewall surface of the opening of the BARC film 52 (see FIG. 4C).

The thickness of the deposits 55 increases gradually from the start of the processing, and becomes, e.g., 32 nm (opening width: 51 nm) after 90 seconds from the start of the processing. As a result of the shrink etching step, the opening width of the opening 54 of the photoresist film 53 is reduced from about 83 nm to about 51 nm, and an opening having a same opening width as the reduced opening width is formed in the BARC film 52. The total thickness of the photoresist film 53 and the BARC film 52 after the shrink etching step is about 163 nm, which indicates that the thickness of the photoresist film 53 has been reduced by about 35 nm.

Thereafter, an SiN etching step for transcribing the opening onto the SiN film 51 serving as a processing target layer is performed on the wafer W having the photoresist film 53 and the BARC film 52 whose opening width has been reduced to about 51 nm by the shrink etching step.

Figure 4D:
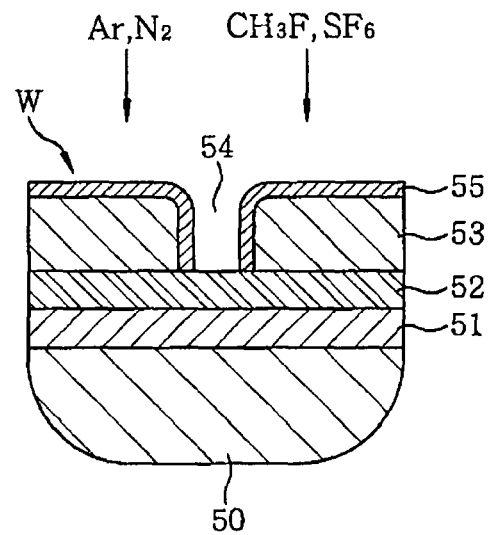

In other words, the wafer W having the opening 54 whose opening width has been reduced to about 51 nm is unloaded from the chamber 22 of the process module 12, and then is loaded into the chamber of the process module 13 via the transfer module 11 so as to be mounted on the mounting table. Next, a pressure in the chamber 22 of the process module 13 is set to, e.g., 3.3 Pa (25 mTorr) by using the APC valve 26 or the like, and a temperature of the wafer W is set to, e.g., about 80° C. A gaseous mixture of Ar gas and $N_2$ gas is supplied from the gas supply unit 30 of the shower head 24 to the chamber 22 at a flow rate ratio of, e.g., 3:1, and a flow rate of, e.g., 800 sccm (Ar gas: 600 sccm, $N_2$ gas: 200 sccm). Further, a gaseous mixture of $CH_3F$ gas and $SF_6$ gas is supplied to the chamber 22 at a flow rate ratio of, e.g., 1:2, and a flow rate of, e.g., 300 sccm ($CH_3F$ gas: 100 sccm, $SF_6$ gas: 200 sccm). In addition, a high frequency power of about 600 W is supplied to the mounting table 23, and a high frequency power of about 200 W is supplied to the shower head 24. At this time, the gaseous mixture of Ar gas and $N_2$ gas and the gaseous mixture of $CH_3F$ gas and $SF_6$ gas are converted into a plasma by the high frequency power applied to the processing space S, thereby generating ions or radicals (FIG. 4D).

Figure 5A:
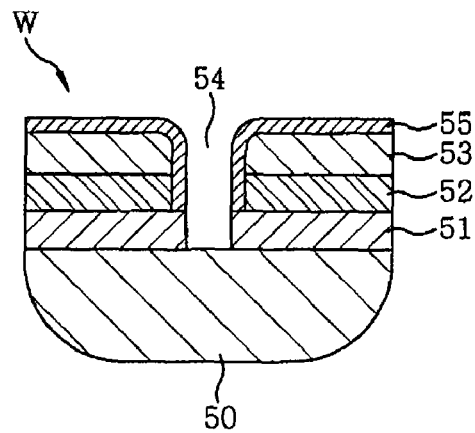
FIGS. 5A to 5C illustrate the steps of the substrate processing method in accordance with the embodiment of the present invention.

These ions or radicals collide and react with the BARC film 52, the photoresist film 53, and the portion of the SiN film 51 which is not covered by the deposits 55, thereby etching the corresponding portion of the SiN film 51 (FIG. 5A). The SiN film 51 is etched until the silicon base member 50 is exposed. In this case, an upper and a lower opening width of the opening 54 in the SiN film 51, which are measured after 60 seconds from the start of the processing, are about 28 nm and about 16 nm, respectively. Further, the total thickness of the photoresist film 53 and the BARC film 52 is about 44 nm, which indicates that the thickness of the photoresist film 53 has been considerably reduced.

The wafer W, in which the opening 54 formed in the photoresist film 53 and having an opening width reduced by the shrink etching step is transcribed onto the SiN film 51, is unloaded from the chamber 22 of the process module 13 and then is loaded into the chamber of the process module 14 via the transfer module 11 so as to be mounted on the mounting table.

Figure 5B:
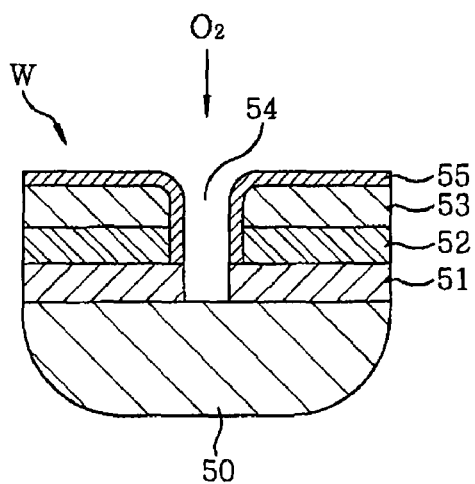
Figure 5C:
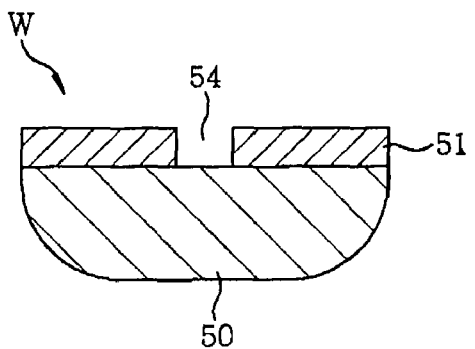

Next, a pressure in the chamber 22 is set to about 1.3×10 Pa (about 100 mTorr) by using the APC valve or the like. Further, a temperature of the wafer W is set to, e.g., 80° C. and, then, an $O_2$ gas is supplied from the gas supply unit 30 of the shower head into the chamber at a flow rate of about 374 sccm. Moreover, a high frequency power of about 0 to 30 W is applied to the mounting table 23 and, at the same time, a high frequency power of about 600 W is supplied to the shower head 24. At this time, the $O_2$ gas is converted into a plasma by the high frequency power applied to the processing space S, thus generating ions or radicals (FIG. 5B). The ions and the radials thus generated are used for an ashing process for ashing the BARC film 52 and the photoresist film 53 stacked on the SiN film 51 and the deposits 55 deposited on the sidewall surface of the opening 54 of the BARC film 52 and the photoresist film 53. Accordingly, the BARC film 52 and the photoresist film 53 stacked on the SiN film 51, and the deposits 55 deposited on the sidewall surface of the opening 54 and the top surface of the photoresist film 53 are removed (FIG. 5C).

The upper and the lower opening width of the opening 54 of the SiN film 51 in the wafer W which are measured after about 20 to 90 seconds from the start of the ashing process are about 29 nm and about 18 nm, respectively. Thereafter, the wafer W is unloaded from the chamber of the process module 14 and, this process is completed.

In accordance with this embodiment, the plasma processing is performed by using a gaseous mixture of $CH_3F$ gas serving as depositive gas and $SF_6$ gas in the shrink etching step. It provides both a shrink effect obtained by adhesion of deposits, which is caused by $CH_3F$ gas, and an etching effect to the BARC film 52, which is caused by $SF_6$ gas. Thus, it is possible to shrink the opening 54 and form an opening having a same opening width as that of the shrunk opening in the BARC film 52.

In this embodiment, the gaseous mixture of $CH_3F$ gas serving as depositive gas and $SF_6$ gas is used as reaction gas. Hence, the adhesion amount of deposits in reducing the opening width can be easily controlled unlike in the case of using only $CH_3F$ gas and, also, the shrink operation can be performed effectively. Besides, it is unnecessary to use a corrosive gas such as HBr or the like, thereby facilitating management of the gas and preventing the processing and the corrosion and damage of the components in the substrate processing system.

In this embodiment, the supply amount of $CH_3F$ gas serving as depositive gas preferably ranges from 100 to 300 sccm, and the supply amount of $SF_6$ gas preferably ranges from 700 to 900 sccm. In other words, the flow rate ratio of $CH_3F$ gas to $SF_6$ gas is preferably 1:2 to 1:9, and more preferably 1:4.

If the flow rate ratio of $SF_6$ gas to $CH_3F$ gas is too low, the etching effect to the BARC film 52 becomes insufficient. On the contrary, if it is too high, the etching effect to the BARC film 52 becomes excessive, and the shrink effect obtained by the adhesion of deposits becomes insufficient. Meanwhile, if the flow rate ratio of $CH_3F$ gas to $SF_6$ gas is too low, the deposits are not sufficiently deposited, and the shrink effect becomes insufficient. On the other hand, if it is too high, the adhesion amount of deposits increases, so that the mouth of the opening is clogged, which results in the insufficient shrink effect and etching effect. If the flow rate ratio of $CH_3F$ gas to $SF_6$ gas is within the aforementioned range, the ions or the radicals reach a lower portion of the BARC film 52 and, thus, the opening can be formed by the etching effect of the $SF_6$ gas. Further, the deposits 55 can be easily deposited on the bottom side wall of the opening, which ensures the excellent shrink effect and etching effect.

$SF_6$ gas having a high content ratio of fluorine effectively provides the etching effect. Since, however, it contains sulfur S, deposits of S-based reaction products are deposited to prevent the roughness and the abrasion of the sidewall surface of the shrunk opening and the top surface of the photoresist film 53, thereby providing a smoothing effect. Accordingly, in a next step, i.e., an SiN etching step, e.g., roundness of the cross sectional shape of the opening is improved, and the cross sectional shape of the opening can be fully transcribed. Meanwhile, when the surface of the photoresist film 53 or the BARC film 52, or the sidewall surface of the opening becomes rough, an opening of an accurate cross sectional shape cannot be formed in the following SiN etching step.

On the other hand, $CH_3F$ gas provides the shrink effect obtained by adhesion of deposits and controls the etching amount of the BARC film 52 caused by $SF_6$ gas.

Besides, in the shrink etching step, the etching amount of the BARC film 52 can be controlled by adjusting the bias power applied to the wafer W mounted on the mounting table 23 without changing reaction gas species.

In this embodiment, the bias power in the shrink etching step preferably ranges from 50 to 150 W. When the bias power is lower than about 50 W, the adhesion of deposits on the sidewall surface of the opening becomes insufficient. On the other hand, when the bias power is higher than about 150 W, the photoresist film 54 easily becomes rough by sputtering. The substrate processing temperature is not particularly limited, but is preferably a room temperature, e.g., about 20 to 100° C., in view of practicability.

In this embodiment, the processing time of the shrink etching step is, e.g., 1 to 2 minutes. The deposit adhesion rate and the etching rate of the BARC film 52 are highest at the start of the processing and decrease gradually to remain nearly unchanged after two minutes.

In this embodiment, the pressure in the chamber in the shrink etching step preferably ranges from 1.3 Pa (10 mTorr) to 6.6 Pa (50 mTorr). If the processing pressure is too low, the substrate surface easily becomes rough. On the contrary, if the processing pressure is too high, the abrasion of the substrate surface occurs easily.

In accordance with this embodiment, the gaseous mixture of Ar, $N_2$, $CH_3F$ and $SF_6$ is used in the SiN etching step, so that the SiN film can be etched with a high selectivity to the photoresist film 53 while reducing the opening width of the opening formed in the photoresist film 53 and the BARC film 52. Thus, it is unnecessary to perform the shrink step in multiple stages. In other words, it is possible to form an opening having an opening width that satisfies a demand for miniaturization of semiconductor devices by sufficiently shrinking the opening width of the opening 54 through the shrink etching step and the SiN etching step following thereafter.

In the SiN etching step, a flow rate of Ar gas preferably ranges from 300 to 900 sccm; that of $N_2$ gas preferably ranges from 100 to 300 sccm; that of $CH_3F$ gas preferably ranges from 50 to 150 sccm; and that of $SF_6$ gas preferably ranges from 100 to 300 sccm. Namely, a flow rate ratio of Ar gas:$N_2$ gas:$CH_3F$ gas:$SF_6$ gas in the SiN etching step is, e.g., 6:2:1:2.

Here, the SiN film 51 is etched mainly by Ar gas. $CH_3F$ gas causes adhesion of deposits to provide an effect of controlling an etching rate (selectivity) of Ar gas. $SF_6$ gas prevents the sidewall of the opening from becoming rough and worn after etching, and compensates or controls the adhesion amount of deposits caused by $CH_3F$ gas. If it is unnecessary to compensate the adhesion amount of deposits due to $CH_3F$ gas, the introduction of $SF_6$ gas can be omitted. $N_2$ gas controls the adhesion amount of deposits caused by $CH_3F$ gas.

In accordance with this embodiment, the shrink etching step makes it possible to shrink the opening width of the opening of the photoresist film 53 and form, in the BARC film 52, an opening having a same opening width as the reduced opening width. Further, in the SiN etching step following thereafter, the opening 54 having an original opening width of about 80 nm can be shrunk and, also, the opening 54 having an upper opening width of about 29 nm and a lower opening width of about 18 nm can be transcribed onto the SiN film 51.

The SiN film 51 is used as a processing target film in the above-described embodiment. However, the processing target film is not limited thereto, and may be a TiN film or another film. Moreover, although the BARC film 52 is used as an intermediate layer, the intermediate layer is not limited to the BARC film.

In the above-described embodiment, a wafer for a semiconductor device is used as a substrate on which plasma processing is performed. However, it is not limited thereto, and various substrates for use in an LCD (Liquid Crystal Display), an FPD (Flat Panel Display) and the like, a photo mask, a CD substrate, a printed circuit board and the like may be employed.

The object of the present invention may also be accomplished by supplying to a system or an apparatus a storage medium storing program codes of software for realizing the functions of the above-described embodiment, and causing a computer (or CPU or MPU or the like) of the system or the apparatus to read and execute the program codes stored in the storage medium.

In this case, the program codes themselves read from the storage medium realize the functions of the above-described embodiment, so that the program codes and the storage medium storing the program codes constitute the present invention.

Moreover, examples of the storage medium for supplying the program codes include a floppy (registered trademark) disk, a hard disk, a magneto-optical disk, an optical disk such as a CD-ROM, a CD-R, a CD-RW, a DVD-ROM, a DVD-RAM, a DVD-RW, a DVD+RW, a magnetic tape, a nonvolatile memory card, and a ROM. Alternatively, the program codes may be downloaded via a network.

Further, it is to be understood that the functions of the above-described embodiment may be accomplished not only by executing the program codes read by a computer, but also by causing an OS (operating system) or the like which operates on the computer to perform a part or all of the actual operations based on instructions of the program codes.

In addition, it is to be understood that the functions of the above-described embodiment may be accomplished by writing program codes read from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program codes.

While the invention has been shown and described with respect to the embodiments, it will be understood by those skilled in the art that various changes and modification may be made without departing from the scope of the invention as defined in the following claims.

What is claimed is:

1. A substrate processing method for processing a substrate on which a processing target layer, an intermediate layer, and a mask layer having an opening to expose a part of the intermediate layer are stacked in this order, the method comprising:

a shrink etching step for reducing an opening width of the opening of the mask layer by depositing deposits on a sidewall surface thereof by a plasma generated from a gaseous mixture of depositive gas expressed by a general formula $C_xH_yF_z$, x, y and z being positive integers, and $SF_6$ gas, and also forming, in the intermediate layer, an opening having an opening width corresponding to the reduced opening width of the opening of the mask layer by etching the intermediate layer, and a processing target layer etching step for transcribing the opening onto the target layer by a plasma generated from a gaseous mixture of Ar gas, $N_2$ gas, depositive gas and $SF_6$ gas or a plasma generated from a gaseous mixture of Ar gas, $N_2$ gas and depositive gas.

2. The method of claim 1, wherein the depositive gas is $CH_3F$ gas.

3. The method of claim 1, wherein a mixing ratio of the depositive gas to the $SF_6$ gas ranges from about 1:2 to about 1:9.

4. The method of claim 3, wherein a mixing ratio of the depositive gas to the $SF_6$ gas is about 1:4.

5. The method of claim 1, wherein in the shrink etching step, a bias power of about 50 W to about 150 W is applied to the substrate.

6. The method of claim 1, wherein processing time of the shrink etching step is about 1 to 2 minutes.

7. The method of claim 1, wherein in the shrink etching step, a pressure in a chamber accommodating the substrate is adjusted to about 1.3 Pa (about 10 mTorr) to about 6.5 Pa (about 50 mTorr).

8. The method of claim 1, wherein the intermediate layer to be etched in the shrink etching step is a bottom anti-reflection coating (BARC) film stacked below the mask layer.

9. The method of claim 1, wherein the processing target layer is an SiN film.

10. The method of claim 1, wherein the processing target layer etching step is carried out by using the plasma of the gaseous mixture of the Ar gas, the $N_2$ gas, the depositive gas and the $SF_6$ gas and a flow rate ratio of the Ar gas, the $N_2$ gas, the depositive gas and the $SF_6$ gas is 6:2:1:2.

11. The method of claim 1, wherein the processing target layer etching step is carried out by using the plasma of the gaseous mixture of the Ar gas, the $N_2$ gas and the depositive gas and a flow rate ratio of the Ar gas, the $N_2$ gas and the depositive gas is 6:2:1.

* * * * *